United States Patent
Edwards et al.

(10) Patent No.: US 11,984,504 B2
(45) Date of Patent: May 14, 2024

(54) POWER TRANSISTOR IC WITH THERMOPILE

(71) Applicant: Texas Instruments Incorporated, Dallas, TX (US)

(72) Inventors: Henry Litzmann Edwards, Garland, TX (US); Andres Arturo Blanco, Garland, TX (US); Orlando Lazaro, Cary, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/538,238

(22) Filed: Nov. 30, 2021

(65) Prior Publication Data

US 2023/0155023 A1    May 18, 2023

Related U.S. Application Data

(63) Continuation-in-part of application No. 17/528,990, filed on Nov. 17, 2021.

(51) Int. Cl.
   *H01L 29/78*      (2006.01)
   *H01L 29/66*      (2006.01)

(52) U.S. Cl.
   CPC .... *H01L 29/7826* (2013.01); *H01L 29/66681* (2013.01)

(58) Field of Classification Search
   CPC .............................. H10N 10/17; H10N 10/82
   See application file for complete search history.

(56) References Cited

U.S. PATENT DOCUMENTS

2017/0012194 A1*  1/2017  Wang .................... H10N 10/17

* cited by examiner

*Primary Examiner* — Raj R Gupta
(74) *Attorney, Agent, or Firm* — Andrew R. Ralston; Frank D. Cimino

(57) ABSTRACT

IC apparatus, and manufacturing methods therefor, that include a power transistor and a thermoelectric device. The power transistor is constructed in a plurality of layers formed over a semiconductor substrate. The thermoelectric device is formed in one or more of the plurality of layers and is sensitive to temperature differences within the IC apparatus resulting from operation of the power transistor.

15 Claims, 12 Drawing Sheets

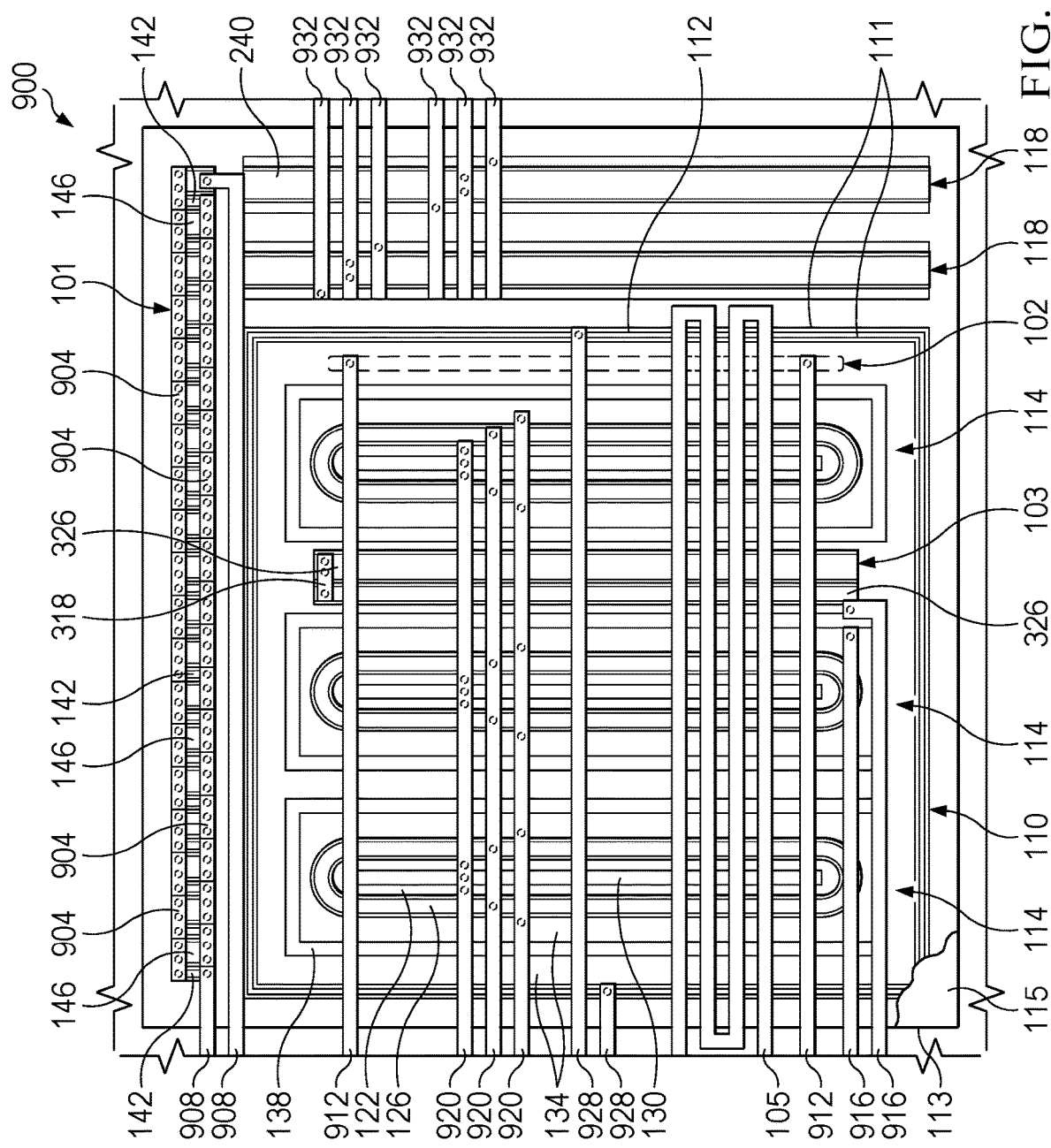

POWER TRANSISTOR IC WITH THERMOPILE

CROSS-REFERENCE TO RELATED APPLICATIONS

This application is a continuation-in-part of U.S. patent application Ser. No. 17/528,990, the content of which is incorporated by reference in its entirety.

TECHNICAL FIELD

The present disclosure relates generally to power transistors in integrated circuits (ICs) and more particularly to a power transistor with an integrated thermopile and methods for making the same.

BACKGROUND OF THE DISCLOSURE

Power field-effect transistor (FET) arrays are subject to high-power and high-temperature stresses that can cause damage. Thermal runaway due to FET self-heating is an example. On-chip temperature sensors based on diodes are often used to prevent such high temperature stress, such as in over-temperature protection circuits. However, ambient or board temperature adds to the chip temperature, so the use of absolute temperature to trigger protection circuits may not accurately respond to thermal runaway. Moreover, existing power FET technology does not include integrated and/or otherwise sufficient means for measuring temperature gradients instead of absolute temperature.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces an IC apparatus comprising a power transistor constructed in a plurality of layers formed in or over a semiconductor substrate, and a thermoelectric device formed in one or more of the plurality of layers, and first and second interconnections respectively electrically connected to first and second terminals of the thermoelectric device, wherein the thermoelectric device is configured to produce a voltage difference between the first and second interconnections in response to temperature differences within the IC apparatus resulting from operation of the power transistor.

The present disclosure also introduces a method of manufacturing an IC, the method comprising forming a power transistor in a plurality of layers formed in or over a semiconductor substrate, as well as forming in one or more of the plurality of layers a thermoelectric device having first and second terminals. The thermoelectric device is configured to produce a voltage difference between the first and second terminals in response to a temperature gradient along the thermoelectric device resulting from operation of the power transistor.

These and additional aspects of the present disclosure are set forth in the description that follows, and/or may be learned by a person having ordinary skill in the art by reading the material herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 14 is a schematic plan view of the apparatus shown in FIG. 1 in a subsequent stage of manufacture according to one or more aspects of the present disclosure.

DETAILED DESCRIPTION

Figure 1:
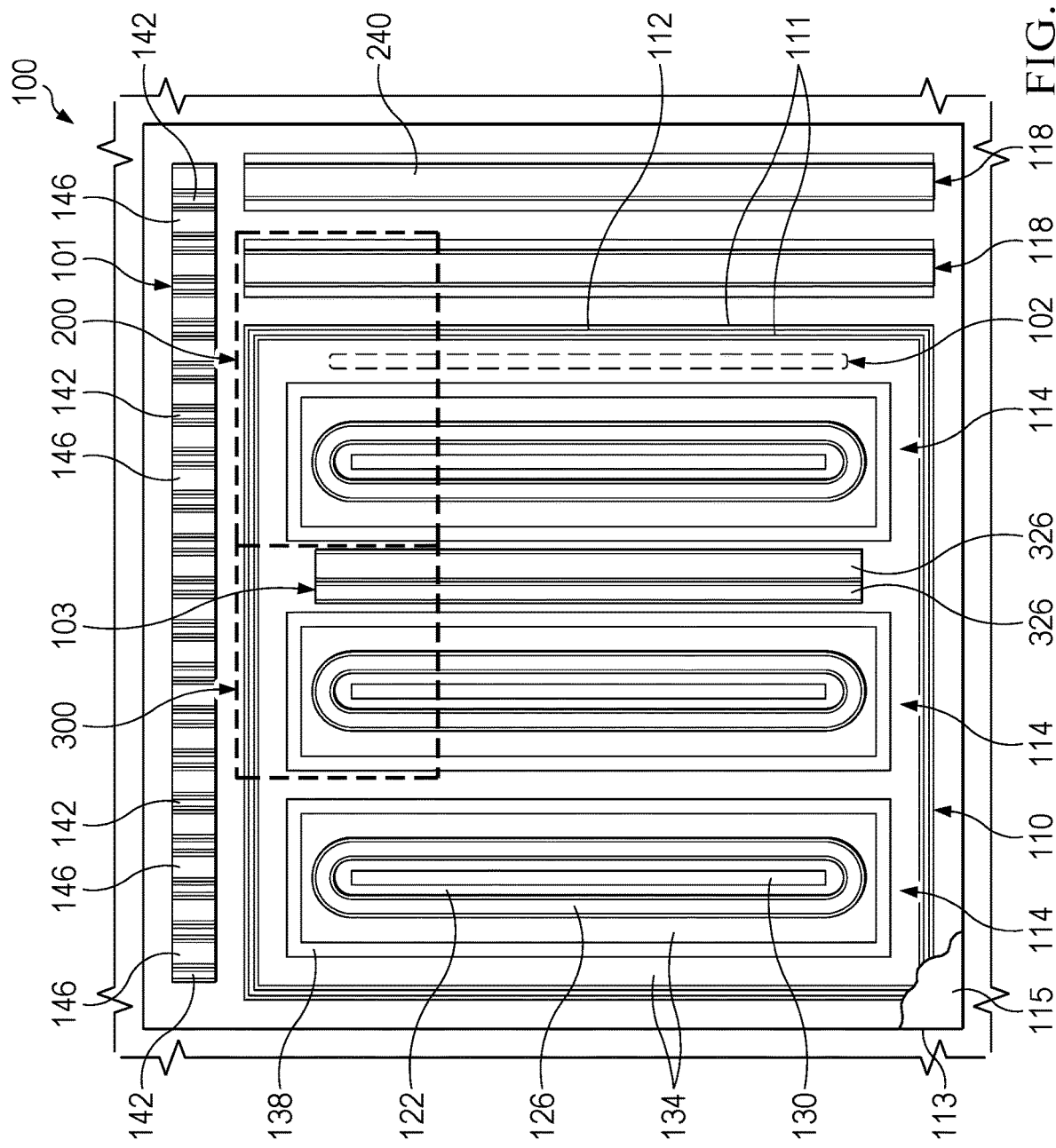
FIG. 1 is a schematic plan view of a portion of an example implementation of a power transistor IC apparatus in an intermediate stage of manufacturing according to one or more aspects of the present disclosure.

The following disclosure is described with reference to the attached figures. The figures are not drawn to scale, and they are provided merely to illustrate the disclosure. Several aspects of the disclosure are described below with reference to example implementations for illustration. It should be understood that numerous specific details, relationships, and methods are set forth to provide an understanding of the disclosure. However, the following disclosure is not limited by the illustrated ordering of acts or events, some of which may occur in different orders and/or concurrently with other acts or events, yet still fall within the scope of the following disclosure. Moreover, not all illustrated acts or events are required to implement a methodology in accordance with the following disclosure.

In addition, although some of the embodiments illustrated herein are shown in two dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present disclosure illustrates by embodiments directed to example devices, it is not intended that these illustrations be a limitation on the scope or applicability of the various implementations. It is not intended that the example devices of the present disclosure be limited to the physical structures illustrated. These structures are included to demonstrate the utility and application of the present disclosure to example (and perhaps preferred) implementations.

It is also to be understood that the following disclosure may provide different examples for implementing different features of various implementations. Specific examples of components and arrangements are described below to simplify the present disclosure. These are, of course, merely examples and are not intended to be limiting. In addition, the following disclosure may repeat reference numerals and/or letters in more than one implementation. This repetition is for simplicity and clarity and does not in itself dictate a relationship between the various implementations and/or configurations discussed. Moreover, the formation of a first feature over or on a second feature in the description that follows may include implementations in which the first and second features are formed in direct contact and/or implementations in which additional features may be formed interposing the first and second features, such that the first and second features may not be in direct contact.

The present disclosure introduces a power transistor with an integrated thermopile constructed from the same material layers used in the power transistor. The thermopile can be connected to circuitry to sense temperature gradients resulting from operation of the power transistor, or an array of power transistors, whether such circuitry is on the power transistor chip or otherwise.

The thermopile is a section of conductive material, such as a metal or a semiconductor. A conductor placed in a temperature gradient exhibits a potential difference along the temperature gradient due to the thermoelectric effects. The Seebeck coefficient is the relationship between the applied temperature gradient and the resulting potential difference.

Figure 2:
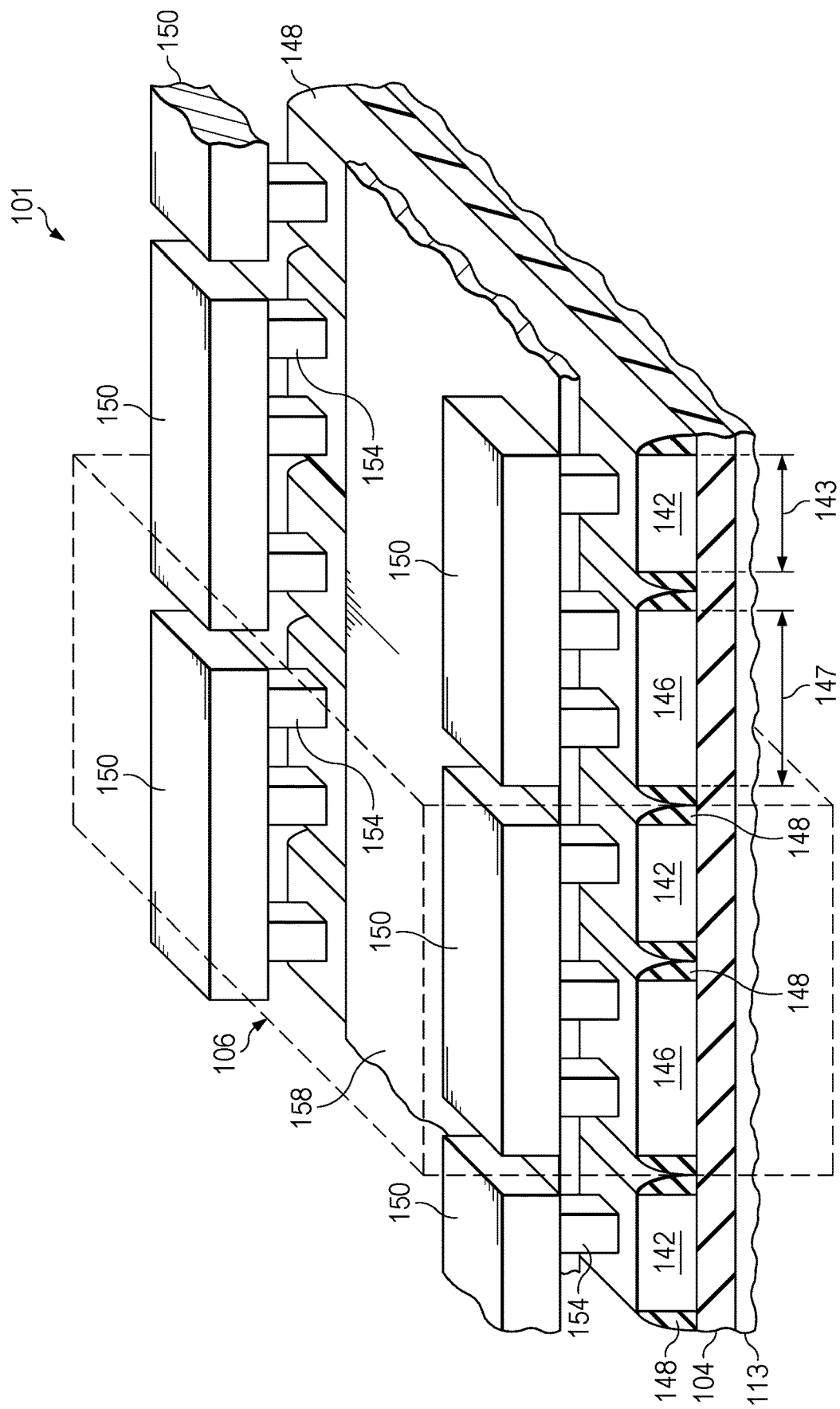
FIG. 2 is a schematic perspective view of a portion of an example implementation of a thermocouple of the apparatus shown in FIG. 1 in a subsequent stage of manufacturing according to one or more aspects of the present disclosure.
Figure 3:
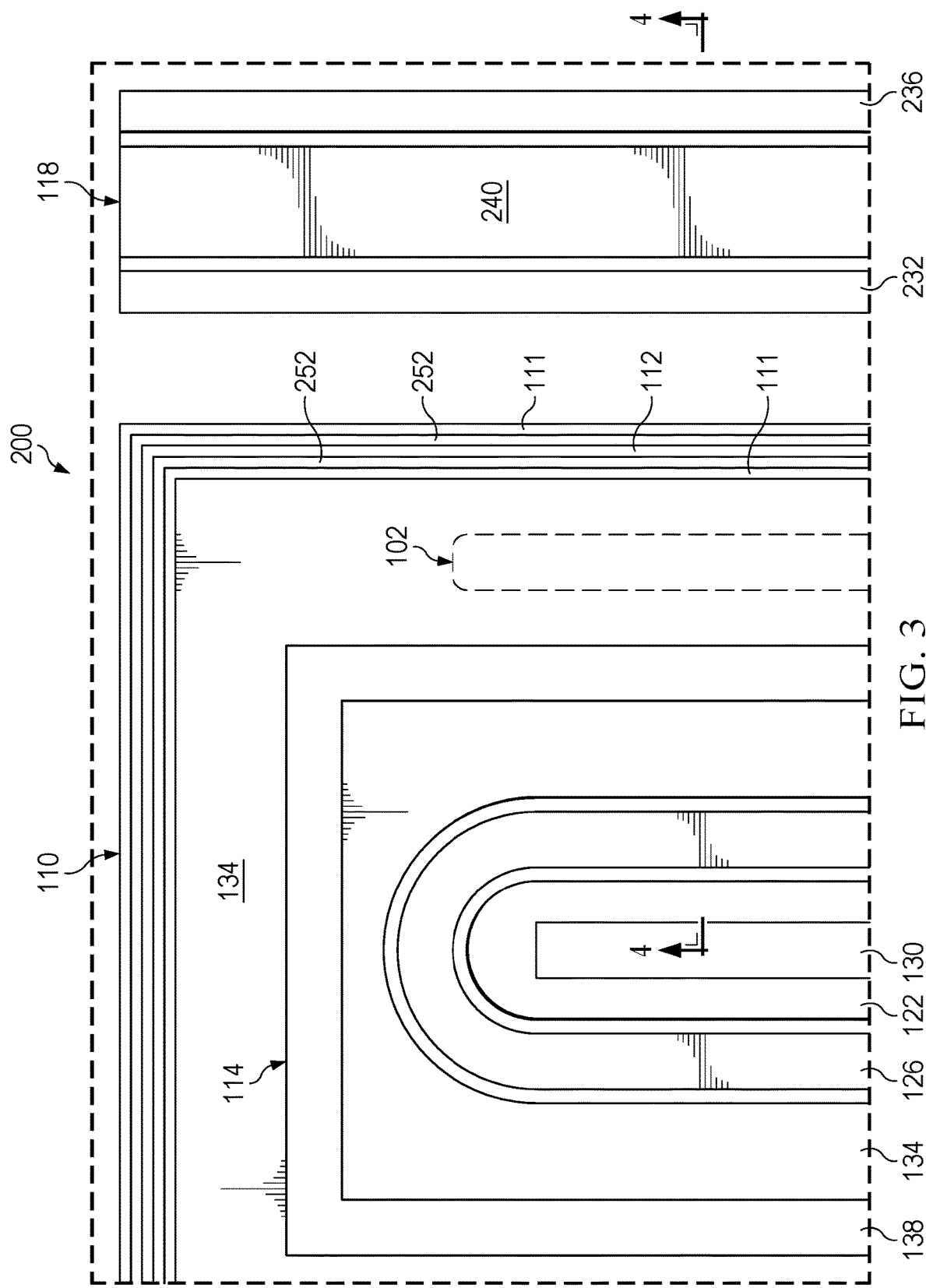
FIG. 3 is an enlarged view of a portion of the apparatus shown in FIG. 1.
Figure 4:
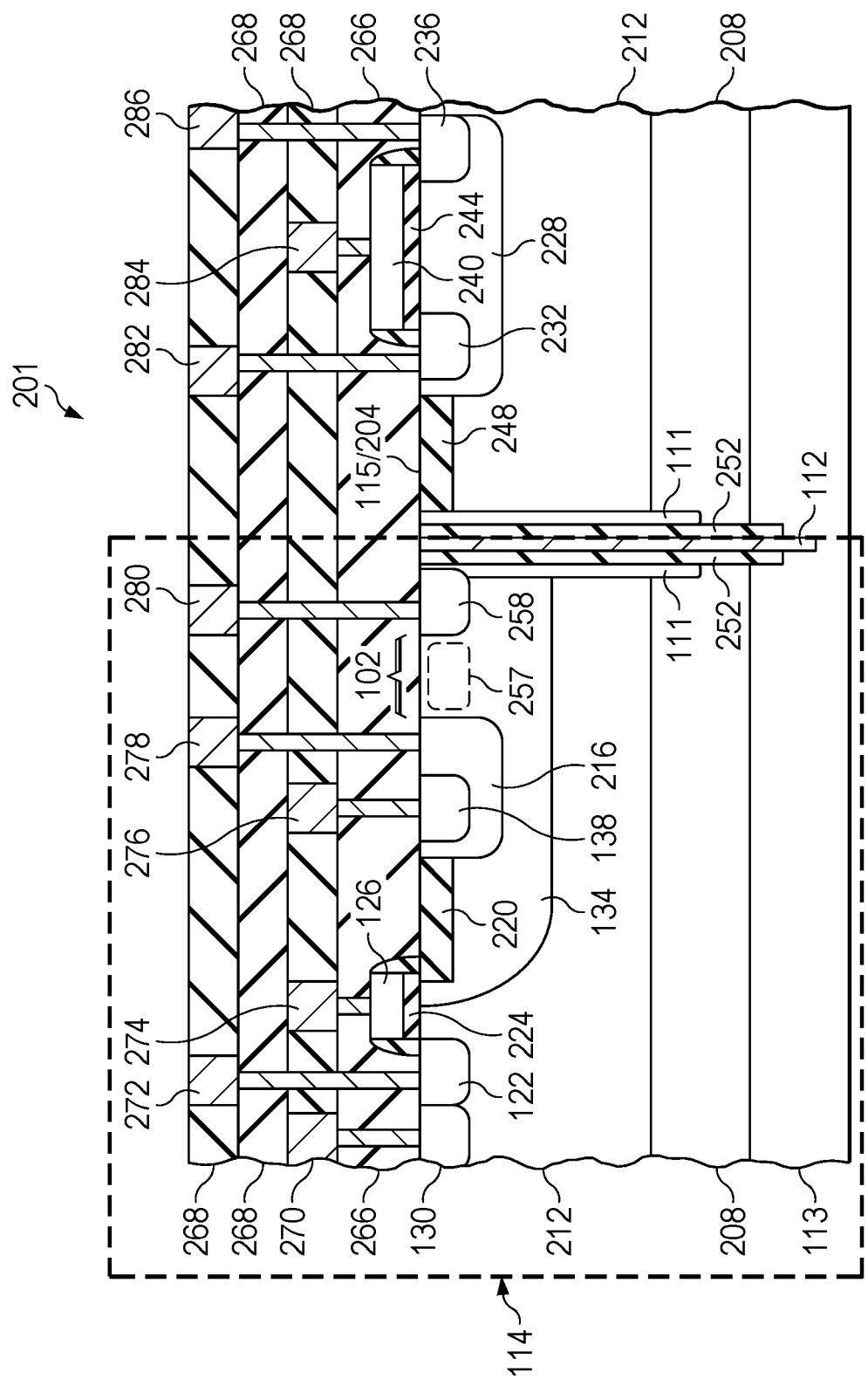
FIG. 4 is a schematic sectional view of an example implementation of the apparatus shown in FIG. 3 in a subsequent stage of manufacturing according to one or more aspects of the present disclosure.
Figure 5:
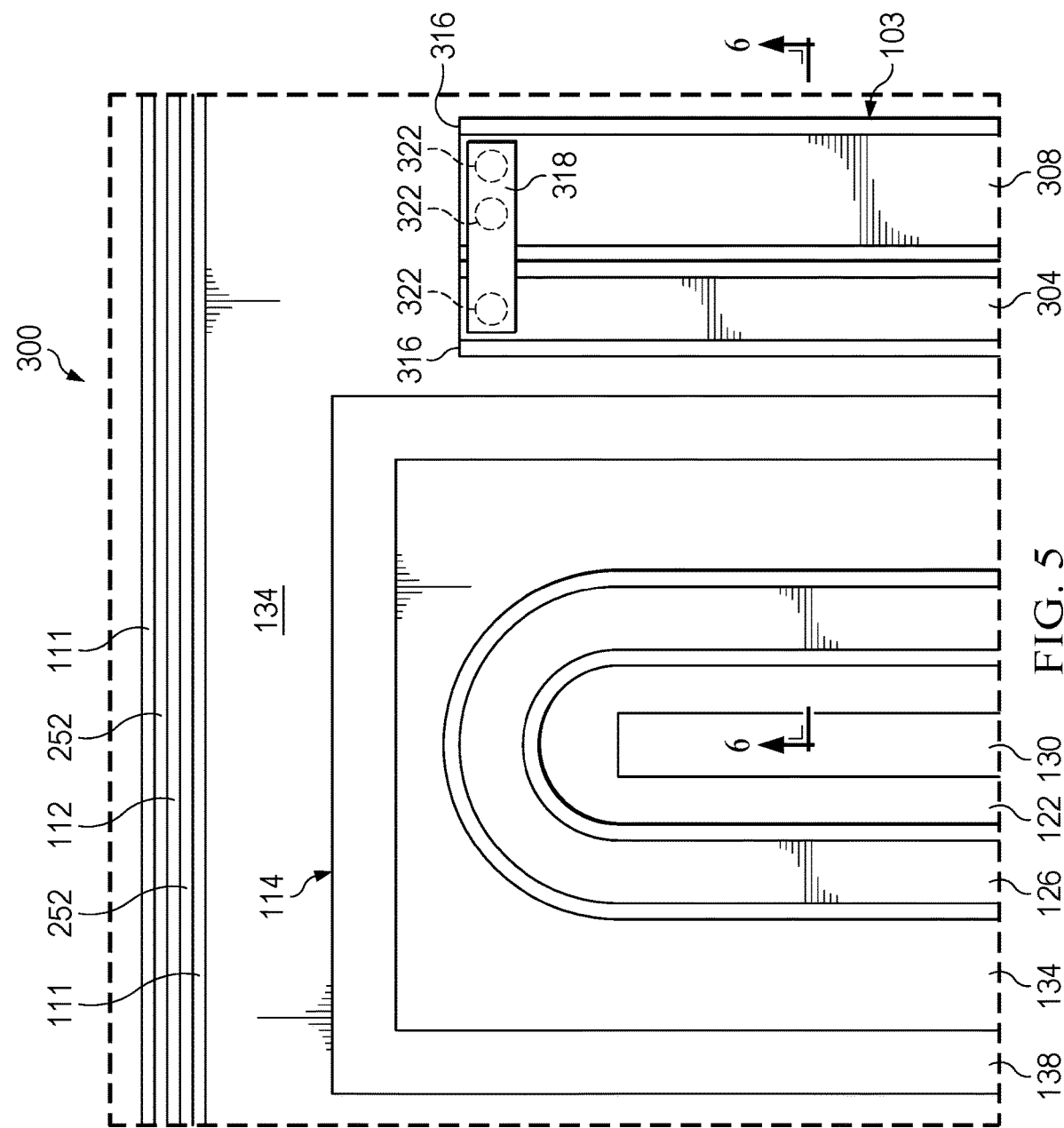
FIG. 5 is an enlarged view of a portion of the apparatus shown in FIG. 1.
Figure 6:
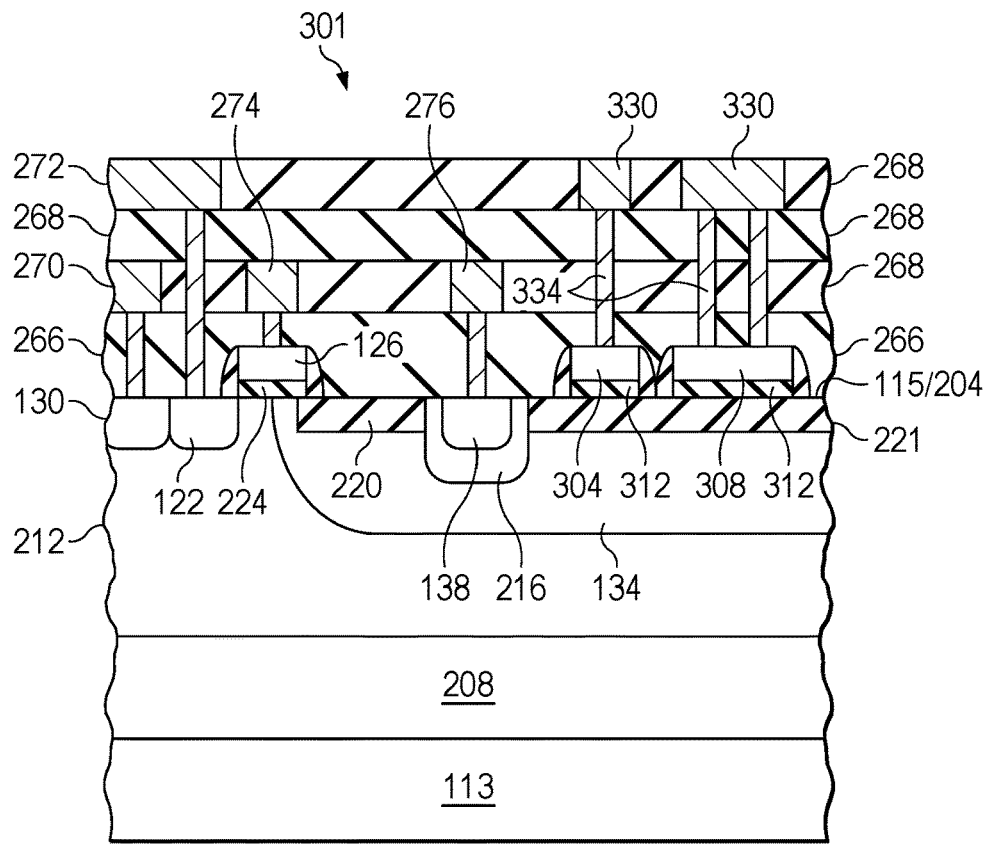
FIG. 6 is a schematic sectional view of an example implementation of the apparatus shown in FIG. 5 in a subsequent stage of manufacturing according to one or more aspects of the present disclosure.

The present disclosure introduces multiple implementations of an IC apparatus comprising a power transistor (or an array thereof) constructed in a plurality of layers formed over a semiconductor substrate, as well as a thermopile formed in one or more of the plurality of layers, wherein the thermopile is sensitive to temperature differences within the IC resulting from operation of the power transistor. For example, FIGS. 1 and 2 depict multiple thermopiles interconnected as an example thermocouple array 101 formed by doped regions of polysilicon outside an isolation structure 110. The isolation structure 110 surrounds an array of three power transistors 114, although other numbers of power transistors 114 may be electrically isolated within the isolation structure 110. FIGS. 1, 3, and 4 depict an example thermopile 102 formed as one or more doped regions of active semiconductor (e.g., crystalline silicon) inside the isolation structure 110. FIGS. 1, 5, and 6 depict an example thermocouple 103 formed as doped regions of polysilicon inside the isolation structure 110. FIGS. 7-13 depict additional example implementations in which a power transistor substrate is utilized as a thermopile, where connections to the substrate are formed simultaneously with the power transistor construction. FIG. 14 depicts another example thermopile 105 formed in an interconnect structure of the power transistor IC.

A power transistor IC apparatus within the scope of the present disclosure may include one or multiple instances of just one of the example thermopiles and/or thermocouples described above, although combinations of the different example thermopiles and/or thermocouples may also be integrated within the power transistor IC. It is also noted that the implementations of thermopiles, thermocouples, transistors, and other devices depicted in the figures are merely examples of the general concepts introduced herein, such that implementations of thermopiles, thermocouples, transistors, and other devices not depicted in the figures may also be within the scope of the present disclosure.

FIG. 1 is a schematic plan view of a power transistor IC apparatus 100 according to one or aspects of the present disclosure. In FIG. 1 (and, in more detail, FIG. 4), the isolation structure 110 is depicted as being a deep trench 111 having an internal conductive portion 112. The internal conductive portion 112 extends to an underlying silicon, gallium arsenide, gallium nitride, silicon carbide, gallium nitride on silicon, and/or other semiconductor material substrate (e.g., a die) 113. The deep trench 111, the internal conductive portion 112, and other possible features of the isolation structure 110 may be formed by known or future-developed means. Other structure(s) may also or instead be utilized to electrically isolate the power transistors 114 from other, perhaps low-power components of the power transistor IC apparatus 100, such as one or more small signal or other "non-power" transistors 118.

As depicted in FIG. 1, each power transistor 114 may comprise a source 122 (with integrated body contact 130 shown in FIG. 4), a gate 126 surrounding the source 122, and a drain 138 surrounding the gate 126 and formed in a deep well 134 that extends laterally from the isolation structure 110 to the gate 126, each such feature being formed by known or future-developed means. However, power transistors other than the source-centered transistors 114 shown in FIG. 1 are also within the scope of the present disclosure.

FIG. 2 is a schematic perspective view of a portion of the thermocouple array 101 shown in FIG. 1. The thermocouple array 101 includes multiple n-doped polysilicon regions ("n-thermopiles") 142 each interposing opposing p-doped polysilicon regions ("p-thermopiles") 146 over a shallow-trench isolation (STI) 104 formed in the semiconductor substrate 113.

The n-thermopiles 142 and the p-thermopiles 146 may be formed by one or more of gate oxidation, polysilicon deposition, polysilicon patterning, polysilicon etching, photoresist removal, polysilicon oxidation, one or more dopant implantations, nitride sidewall formation, silicide block oxide deposition and patterning, and/or other processes utilized to define the gates 126 and/or other polysilicon features of the power transistors 114. The thermopiles 142, 146 may be implanted (whether during deposition or thereafter) during implant processes performed to form correspondingly doped features of the power transistors 114.

The n-thermopiles 142 may be implanted and/or otherwise formed simultaneously with, and thus to the same dopant concentration as, an n-doped region of the power transistors 114, such as an n-doped source/drain region (NSD, such as source/drain regions 122, 138), a lightly n-doped source/drain region (NLDD), an n-type implant of polysilicon (NPOLY), or other n-doped features. Similarly, the p-thermopiles 146 may be implanted and/or otherwise formed simultaneously with, and thus to the same dopant concentration as, a p-doped region of the power transistors 114, such as a p-doped source/drain region (PSD), a lightly p-doped source/drain region (PLDD), a p-type implant of polysilicon (PPOLY), or other p-doped features. Dielectric spacers 148 electrically isolating the n-thermopiles 142 and the p-thermopiles 146 may be formed simultaneously with gate sidewall spacers (e.g., the unreferenced spacers depicted in FIG. 4).

Using a doped semiconductor material as the body (e.g., the thermoelectric portion) of the thermopiles 142, 146 offers the advantage of the high mobility and high Seebeck coefficient of semiconductors. The thermoelectric effect of a thermopile creates an open-circuit voltage ($V_{OC}$) proportional to the temperature difference across the thermopile, such that $V_{OC}=S\Delta T$, where S is the Seebeck coefficient. The Seebeck coefficient is negative for n-doped semiconductors and positive for p-doped semiconductors. The thermopiles 142, 146 shown in FIG. 2 arranged as an array 101 of thermocouples 106 each having an n-thermopile 142 and a p-thermopile 146. The thermocouples 106 are connected in series to increase the measurable voltage (e.g., the $V_{OC}$ of each thermopile 142, 146), thus increasing thermoelectric gain. Such connections are depicted in FIG. 2 (as well as FIG. 14, but not in FIG. 1) as portions of an interconnect structure comprising traces or other conductors 150 electrically connecting (through vias 154) alternating ends of the thermopiles 142, 146.

FIG. 2 also depicts optimizing the power factor $S^2/R$ (where R is resistance) by forming the lower-mobility p-doped thermopiles 146 with a width 147 that is greater than the width 143 of each high-mobility n-doped thermopile 142. For example, the widths 147 may be 25-500% greater than the widths 143, depending on the sheet resistance ratio in a particular implementation.

FIG. 2 also depicts that, if the doping concentrations of the n-thermopiles 142 and the p-thermopiles 146 are the same, the n-thermopiles 142 can have a smaller width 143 than the width 147 of the p-thermopiles 146 because the mobility of electrons in polysilicon is higher than the mobility of holes. However, it is possible that the thermopiles 142, 146 have unequal doping concentrations. Thus, another way to specify the widths 143, 147 is by the square root of the ratio of sheet resistances. For example, if the n-thermopiles 142 each have a sheet resistance of 10 ohm-centimeter (ohm-cm), and the p-thermopiles 146 each have a sheet resistance of 20 ohm-cm, then the width 147 of each p-thermopile 146 should be about 1.4 (the square root of 2) times more than the width 143 of each n-thermopile 142, assuming that (as depicted in the example array 101 implementation of FIG. 2) the thermopiles 142, 146 are equal in length.

FIG. 2 also depicts a silicide block or other layer 158 overlying a substantial portion (e.g., at least 50-75%) of each thermopile 142, 146. Such layer 158 may aid in insuring that metallic or other conductive material formed over the thermopiles 142, 146 do not disrupt the thermoelectric function of the thermocouple array 101.

FIG. 3 is a schematic plan view of a portion 200 of the power transistor IC apparatus 100 shown in FIG. 1. FIG. 4 is a schematic sectional view of a portion 201 of the power transistor IC apparatus portion 200 in a subsequent stage of manufacture according to one or more aspects of the present disclosure. The following description refers to FIGS. 3 and 4, collectively.

The deep trench 111 of the power transistor IC portions 200, 201 may be an n-doped trench 111. The power transistor IC apparatus portions 200, 201 comprise an n-type isolation tank formed by the n-doped deep trench 111 extending through multiple layers from a plane 204 to an NBL 208. The plane 204 is parallel to the bearing surface 115 of the semiconductor substrate 113. The NBL 208 is implanted and driven (e.g., by anneal) into a p-type semiconductor substrate 113 to underly the array of power transistors 114, thereby also defining a PBL or other p-doped region 212 comprising channel regions of the power transistors 114. The PBL 212 contains a deep n-doped well (DNWELL) 134 along with the integrated p+ doped back gate/body connect 130 and n+ doped source 122. The DNWELL 134 contains a shallow n-doped well (SNW) 216, which contains the n+ doped drain 138. An STI 220 or other insulating means (e.g., local oxidation of silicon (LOCOS)) extends laterally within the DNWELL 134 from the SNW 216 to underneath the gate 126. The gate 126 is formed on an oxide or other gate dielectric layer 224. As described above, these and/or other features of the power transistors 114 may be formed by known or future-developed processes. It is also noted that the above-described features of FIGS. 3 and 4 are for a p-channel metal-oxide-semiconductor (PMOS) version of the power transistors 114. However, in other implementations within the scope of the present disclosure, one or more of the power transistors 114 may be an n-channel metal-oxide-semiconductor (NMOS), such as may comprise a shallow p-doped well (SPW) and PSDs (none shown).

Each non-power transistor 118 comprises an SNW 228 contained in the PBL 212, perhaps formed simultaneously with and/or to the same dopant concentration as the SNW 216. The SNW 228 contains a p+ doped source 232 and a p+ doped drain 236, both of which may be formed simultaneously and/or to the same dopant concentration as the p+ doped back gate/body connect 130. Each non-power transistor 118 comprises a gate 240 and a gate dielectric layer 244, one or both of which may be formed simultaneously with the gates 126 and gate dielectrics 224, respectively, of the power transistors 114. An STI 248 or other insulating means (e.g., LOCOS) extends laterally between the n-doped deep trench 111 and the SNW 228. The STI 248 may be formed simultaneously with the STI 220.

The isolation structure 110 electrically isolates the power transistors 114 from the non-power transistors 118 and/or other devices formed on the substrate 113. In the example implementation depicted in FIG. 4, the isolation structure 110 includes the n-doped deep trench 111 extending from the plane 204 to the NBL 208, an inner conductive portion 112 extending from at least the plane 204 to the substrate 113, and a dielectric trench 252 electrically isolating the inner conductive portion 112 and the substrate 113 from the n-doped deep trench 111 and the NBL 208. The inner conductive portion 112 may be metallic or doped polysilicon, such as p-doped polysilicon when the substrate 113 is a p-type semiconductor substrate.

The power transistor IC portions 200, 201 also comprise the example thermopile 102, which is an n-type thermopile 102 formed in the n-doped portion of the periphery of the power transistors 114 within the n-type isolation tank, such as in the n-type drift region located at the peripheral portion of the DWELL 134 and extending laterally between the SNW 216 and the n-doped deep trench 111. For example, the SNW 216, which comprises the heavily n-doped active semiconductor region that is the drain contact 138, may also be a drain ohmic connection for the n-thermopile 102, in that it is connected to, and has a doping profile merged with, an inner portion 257 of the n-thermopile 102. The n-thermopile 102 may also comprise an n-isolation ohmic connection comprising another heavily n-doped active semiconductor region 258 that is connected to, and has a doping profile merged with, outer edges of the n-type isolation tank (e.g., the inner portion of the n-doped deep trench 111). The thermoelectric portion (e.g., including inner portion 257) of the n-thermopile 102 may be doped with n-type doping that is also utilized for the n-doped deep trench 111 (DTDPN), DEEPN-level doping, SWELL-level doping, or others, whether simultaneous with such implants utilized while constructing the power and/or non-power transistors 114, 118, or as one or more additional implant processes.

Heat generated by the power transistors 114 may be sensed by the thermoelectric voltage across the n-thermopile 102, which develops in response to the substantially radial lateral temperature gradient caused by the heat flowing from the power transistors 114. The thermopile 102 may exhibit a Seebeck coefficient of 100-500 µV/K, which provides a millivolt (mV) level signal that rides on a high-voltage drain potential. Thus, differential sensing circuitry (not shown) may be utilized for such thermoelectric voltage signals.

Each power transistor 114 has been described with respect to FIG. 4 as a lateral double-diffused metal-oxide-semiconductor field-effect transistor (LDMOS) built with a source-centered geometry, such as may be utilized as a high-side power transistor contained within the n-type isolation tank. However, the thermopile 102 may be readily adapted for use with other power transistors, such as a metal-oxide-semiconductor field-effect transistor (MOSFET), a drain-extended MOSFET (DEMOS), a metal-insulator-semiconductor field-effect transistor (MISFET), a bipolar junction transistor, and/or other power transistors. Such power transistors may also be p-type transistors instead of n-type transistors.

FIG. 4 also depicts an example interconnect structure for the power transistor IC portion 201. A pre-metal dielectric (PMD) layer 266 covers the gates 126, 240, their respective sidewall spacers (not referenced), and the portions of the surfaces in the plane 204 that are not covered by the gates 126, 240 and their spacers. A plurality of dielectric layers 268 cover the PMD layer 266, including several that include traces and other conductors connected to the contacts of the power transistors 114, the non-power transistors 118, and the n-thermopile 102. For example, corresponding unreferenced vias connect: a conductor 270 to the back gate/body connect 130; a connector 272 to the source 122; a connector 274 to the gate 126; a connector 276 to the drain 138; a connector 278 to the positive or "hot end" of the n-thermopile 102; a conductor 280 to the negative or "cold end" of the n-thermopile 102; a connector 282 to the source 232; a connector 284 to the gate 240; and a connector 286 to the drain 236.

FIG. 5 is a schematic plan view of a portion 300 of the power transistor IC apparatus 100 shown in FIG. 1. FIG. 6 is a schematic sectional view of a portion 301 of the power transistor IC apparatus portion 300 in a subsequent stage of manufacture according to one or more aspects of the present disclosure. The following description refers to FIGS. 5 and 6, collectively.

The power transistor IC portions 300, 301 include the n-type isolation tank formed by the n-doped deep trench 111 and the NBL 208, as well as the PBL 212 in which the p+ doped back gate/body connect 130, the n+ doped source 122, and the DNWELL 134 are formed. As with the example depicted in FIG. 4, the DNWELL 134 contains the SNW 216, which contains the n+ doped drain 138, as well as the STI 220 extending laterally from the SNW 216 to underneath the gate 126.

The power transistor IC portions 300, 301 also comprise the thermocouple 103, which is formed from doped polysilicon on a dielectric formed above the active semiconductor material. For example, in the depicted example implementations, the thermocouple 103 comprises an n-doped polysilicon thermopile 304 and a p-doped polysilicon thermopile 308, each of which are formed on dielectric layers 312 over the DNWELL 134 within the lateral boundaries of the n-type isolation tank. Another STI 221 extends laterally from the SNW 216 to underneath the n-thermopile 304 and the p-thermopile 308. Adjacent ends 316 of the thermopiles 304, 308 may be electrically connected by a conductor 318 and vias 322 that are formed as part of an interconnect structure, such as in a manner similar to the conductors 150 and vias 154 shown in FIG. 2 and as described below with respect to FIG. 14. The other ends 326 (see FIG. 1) of the doped polysilicon thermopiles 304, 308 are connected to conductors 330 and vias 334 of the interconnect structure schematically depicted in FIG. 6, which may also form a portion of the interconnect structure shown in FIG. 14.

The thermopiles 304, 308 may be formed simultaneously with the gates 126 of the power transistors 114 and/or the gates of the non-power transistors 118. Similarly, the dielectric layers 312 may be formed simultaneously with the gate dielectrics 224 of the power transistors 114 and/or the gate dielectrics 244 of the non-power transistors 118. For example, a dielectric material may be deposited on the active semiconductor surface 115, and then polysilicon may be deposited on the dielectric, where each deposition may be by chemical vapor deposition (CVD) and/or other processes. The polysilicon may be doped in-situ during the deposition and/or after the deposition. The polysilicon and the underlying dielectric may then be patterned to form the thermopiles 304, 308 simultaneously with the gates 126 of the power transistors 114 and/or the gates 240 of the non-power transistors. However, the thermopiles 304, 308 and/or the dielectric layers 312 may be formed by other processes simultaneous with the formation of other features of the power and/or non-power transistors 114, 118. For example, the thermopiles 304, 308 may be defined in a doped layer in the same polysilicon that is used as transistor gates, resistors, and/or capacitor plates (not shown). The doping can include layers such as NSD, PSD, NLDD, PLDD, DWELL, or similar doping layers. Using doped polysilicon has the advantage of the high Seebeck coefficient of semiconductors.

FIGS. 7-13 are schematic views of example implementations of the power transistor IC apparatus 100 shown in FIG. 1 demonstrating the substrate 113 being utilized as a thermoelectric body of a thermopile. That is, heat flow is sensed by the temperature difference between various lateral positions of the substrate 113 using electrical connections to the substrate 113. In trench-isolated implementations, such as in FIGS. 7-10, the inner conductive portion 112 of the isolation structure 110 can be utilized for the electrical connections to the substrate 113. In junction-isolated implementations, such as in FIGS. 11-13, various existing p-doped features can be utilized for the electrical connections to the substrate 113.

Figure 7:
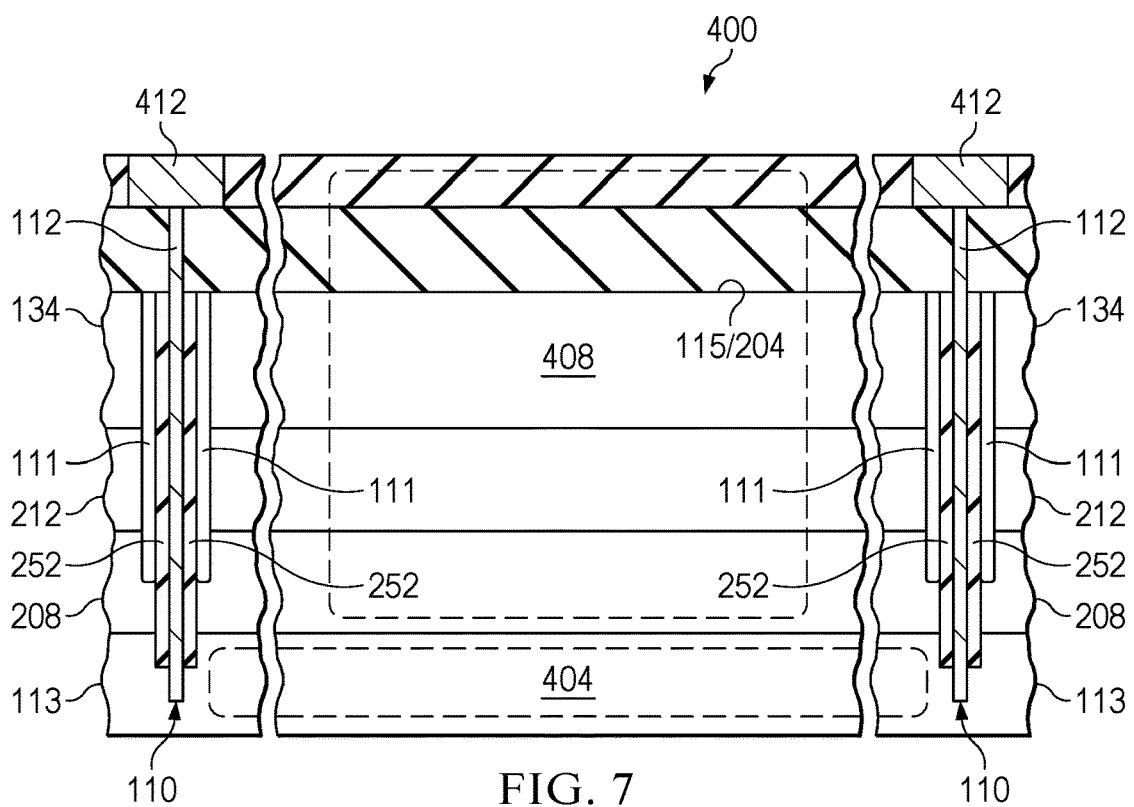
FIG. 7 is a schematic side view of a portion of an example implementation of the apparatus shown in FIG. 1.

FIG. 7 is a schematic side view of a portion 400 of an example implementation of the power transistor IC apparatus 100 shown in FIG. 1, wherein the substrate 113 is a p-type substrate having a portion 404 being utilized as the thermoelectric portion of a thermopile, and wherein the inner conductive portions 112 of two isolation structures 110 are formed of p-doped polysilicon and extend from at least the plane 204 to the p-type substrate 113, including through the DWELL 134, the PBL 212, and the NBL 208. The two isolation structures 110 are on opposing sides of one or an array of power transistors, such as the power transistors 114 described above. However, for clarity and ease of understanding, details of such power transistors have not been included in the depiction of the example power transistor IC apparatus portion 400 shown in FIG. 7. Instead, such details are generally denoted by reference number 408. The inner conductive portions 112 of the isolation structures 110 are also depicted in FIG. 7 as extending above the plane 204 to corresponding conductors 412. However, connection between the conductors 412 and the inner conductive portions 112 may also include one or more vias, traces, and/or other intervening conductors (not shown).

Figure 8:
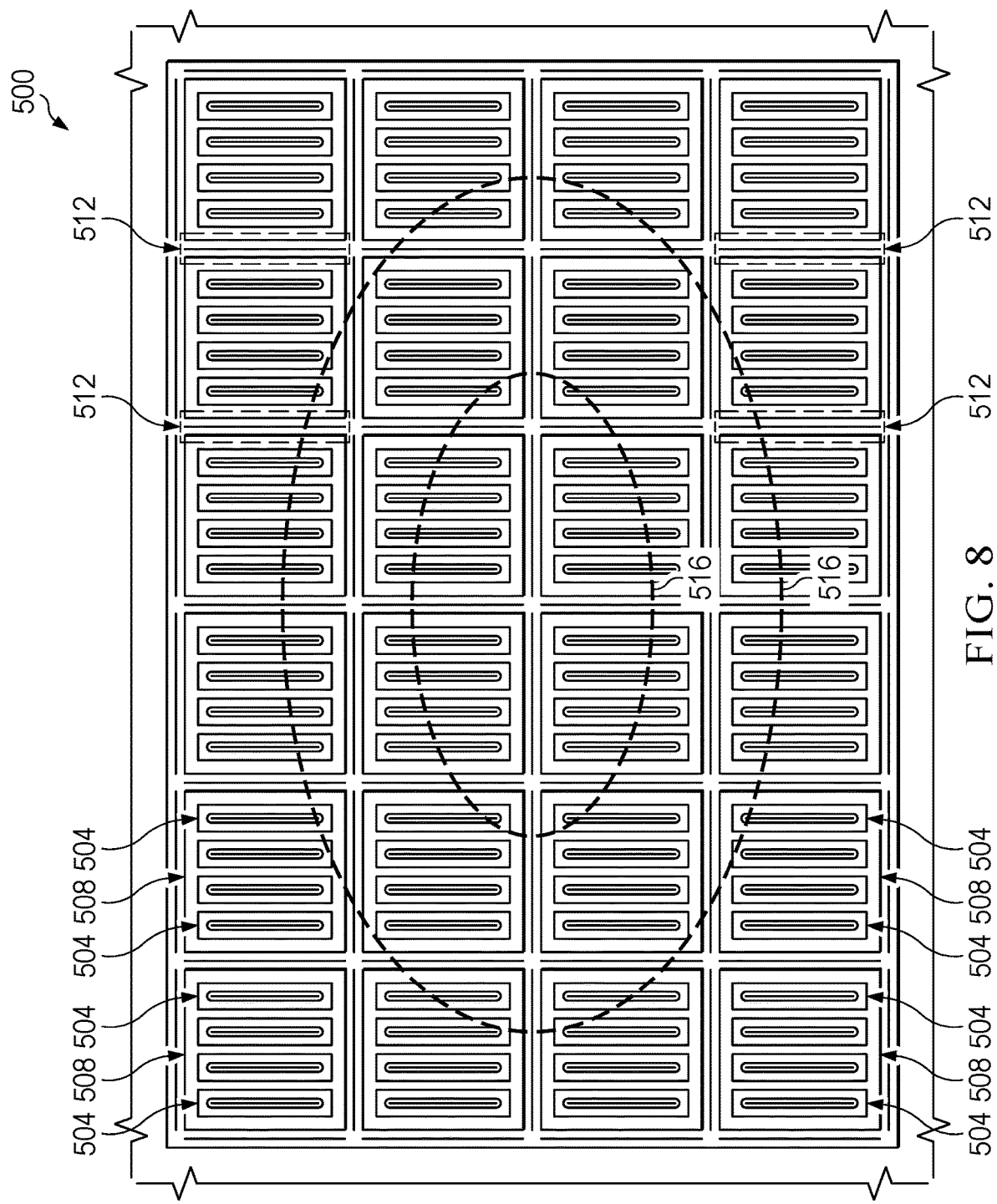
FIG. 8 is a schematic plan view of a portion of another implementation of the apparatus shown in FIG. 1 according to one or more aspects of the present disclosure.

FIG. 8 is a schematic plan view of an example implementation of a power transistor IC apparatus 500 in which the power transistor IC apparatus portion 400 shown in FIG. 7 may be utilized. The apparatus 500 includes an array of power transistors 504 separated into a plurality of transistor banks 508. In the example implementation depicted in FIG. 8, the apparatus 500 includes transistor banks 508 arranged in four rows and six columns, although other numbers of rows and columns are also possible. The transistor banks 508 are isolated by instances 512 of the isolation structure 110 described above. Each instance 512 includes the inner conductive portion 112 extending into the substrate 113. In the intermediate manufacturing stage depicted in FIG. 8, the upper end of each inner conductive portion 112, or one or more conductors connected thereto, is exposed (i.e., uncovered). Operation of the power transistors 504 will result in heat generation, depicted in FIG. 8 by equithermal lines 516.

Figure 9:
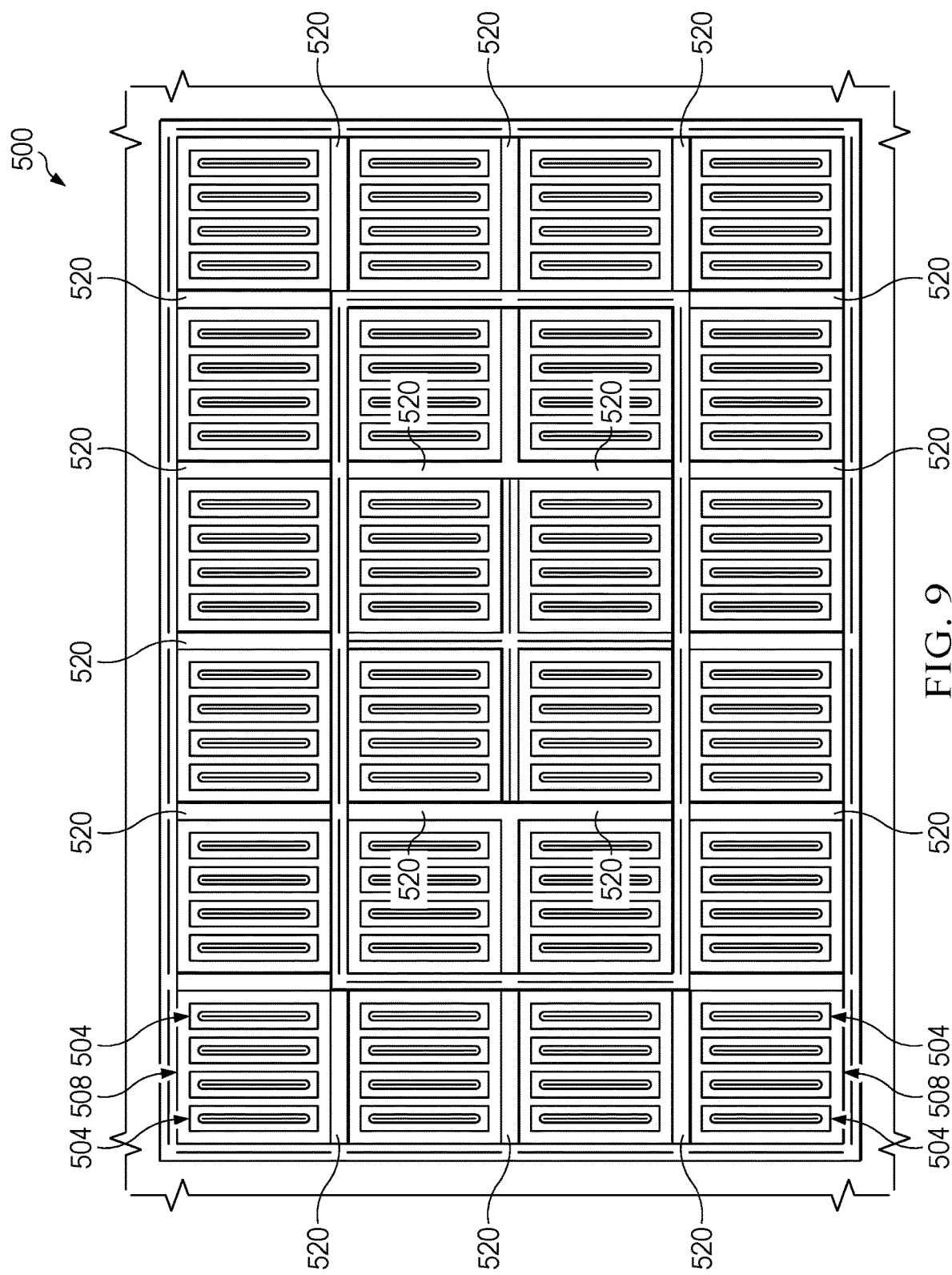
FIG. 9 is a schematic plan view of the apparatus shown in FIG. 8 in a subsequent stage of manufacture according to one or more aspects of the present disclosure.
Figure 10:
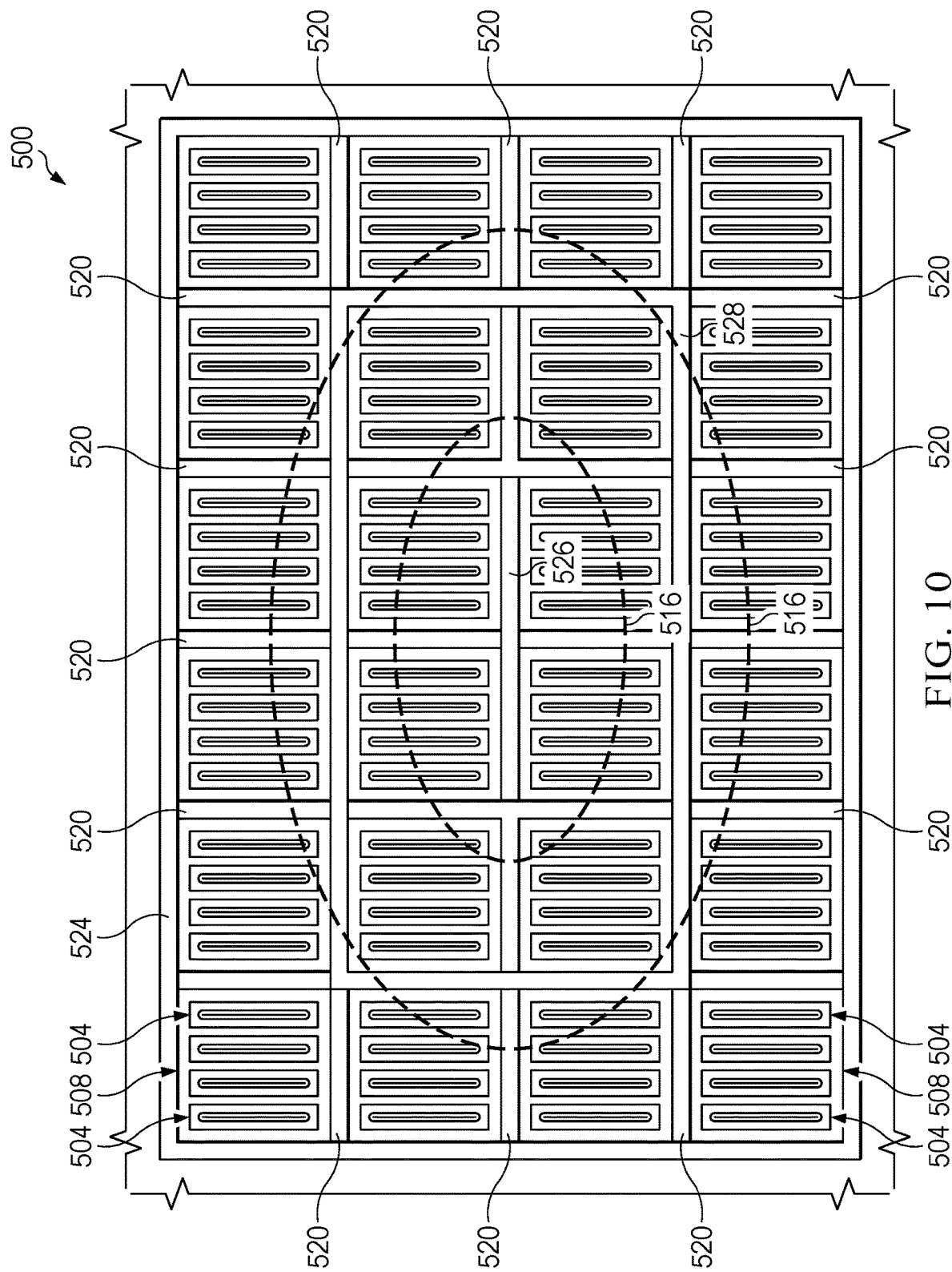
FIG. 10 is a schematic plan view of the apparatus shown in FIG. 9 in a subsequent stage of manufacture according to one or more aspects of the present disclosure.

FIG. 9 is a schematic plan view of the power transistor IC apparatus 500 shown in FIG. 8 in a subsequent stage of manufacture, in which portions 520 of a silicide blocking material have been formed over ones of the inner conductive portions 112, so that a subsequently formed silicide layer is not deposited over the blocked ones of the inner conductive portions 112. FIG. 10 is a schematic plan view of the power transistor IC apparatus 500 shown in FIG. 9 in a subsequent stage of manufacture, in which metallic conductors have been formed over the isolation structure portions that were not covered by the silicide block 520. Accordingly, an outer metal conductor 524 is formed around the perimeter of the array of power transistors 504, an inner metal conductor 526 is formed between the second and third rows of transistor banks 508 but only within the third and fourth columns of transistor banks 508, and an intermediate conductor 528 is formed around the transistor banks 508 of the second and third rows except for those in the first and last columns. The conductors 524-528 contact the underlying inner conductive portions 112 of the isolation structure, thereby connecting to and forming p-type ohmic connections laterally disposed in the depicted pattern, which is based on the equithermal lines 516 of the array. Accordingly, the apparatus 500 comprises a plurality of p-type thermopiles each comprising p-type ohmic connections (inner conductive portions 112) extending through the layers of the apparatus 500 to different corresponding portions of a bulk portion of the semiconductor substrate 113. The pattern of the conductors 524, 526, 528, collectively, may be co-symmetric with the equithermal lines 516. For example, major and minor lateral axes of each conductor 524, 526, 528 and each equithermal line 516 may each be colinear with respective major and minor axes of the array of transistor banks 508.

In operation, the heat generated by the power transistors 504 will be experienced by the substrate 113 (FIG. 7) and thermoelectrically alter a voltage between the intermediate conductor 528 and each of the inner and outer conductors 526, 524. This voltage can be detected by additional circuitry (not shown) to determine the thermal gradients extending radially outward from the center of the power transistor array.

In addition to the trench-isolated implementation for utilizing the substrate as the thermoelectric portion of a thermopile, as described above with respect to FIGS. 7-10, the present disclosure also introduces junction-isolated implementations. That is, instead of utilizing the inner conductive portions 112 of the isolation structures 110 as the p-type ohmic connections to the substrate 113, the p-type ohmic connections may be formed by corresponding portions of a p-type region of active semiconductor formed in the semiconductor layer that also contains p-type source/drain regions of the power transistors 114 (thus possibly having the same dopant concentration as the p-type source/drain regions) and portions of an SPWELL underlying the active semiconductor.

Figure 11:
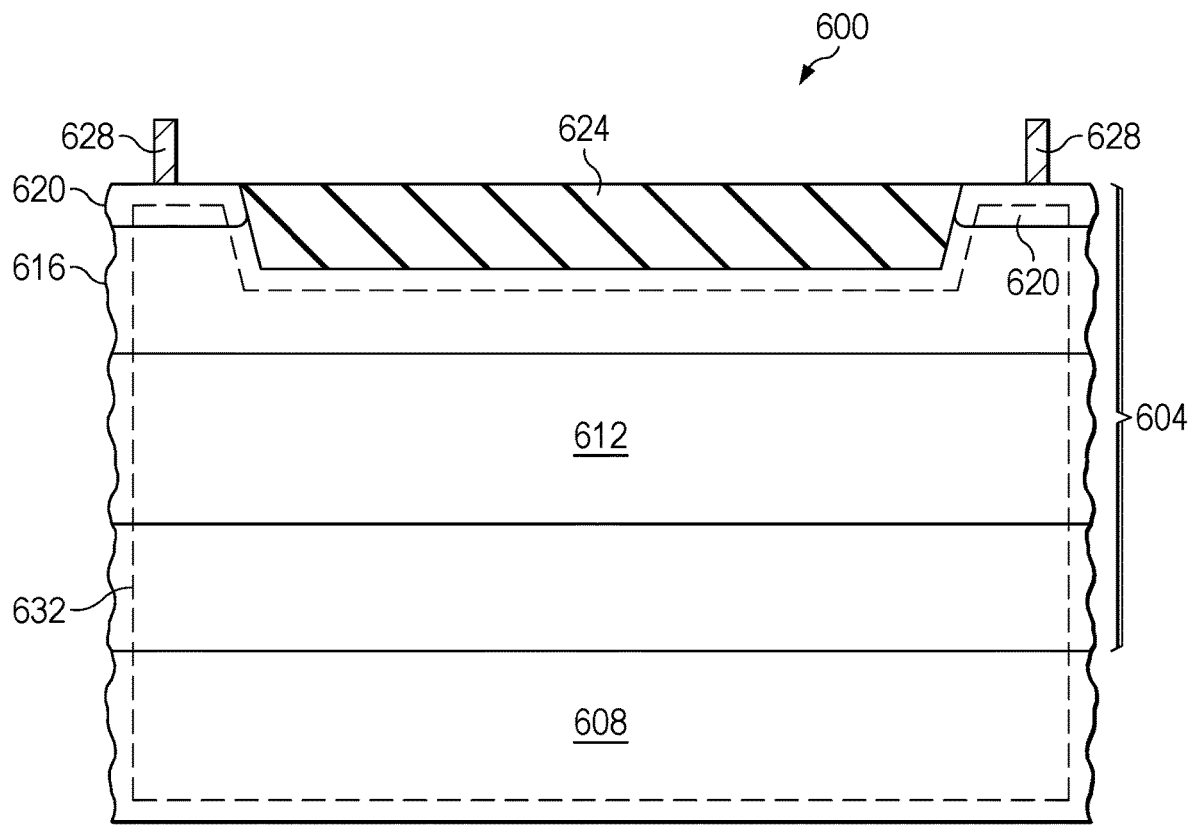
FIG. 11 is a schematic sectional view of another example implementation of the apparatus shown in FIG. 7.

For example, FIG. 11 is a schematic sectional view of a portion 600 of an example implementation of the power transistor IC apparatus 100 shown in FIG. 1. The portion 600 comprises a p-doped epitaxial layer (p-epi) 604 on a p-type substrate 608. A PBL and/or p-type reduced surface electric field region (PRSRF) 612, an SPWELL 616, and a PSD-doped active semiconductor region (or moat) 620 are formed in the p-epi 604. The doped region 620 extends laterally around an STI 624, which extends vertically through the doped region 620 into the SPWELL 616. Contacts 628 connect to the doped region 620 for sensing the thermopile voltage. The dashed lines 632 indicate the semiconductor portions that act as the p-type thermopile.

Figure 12:
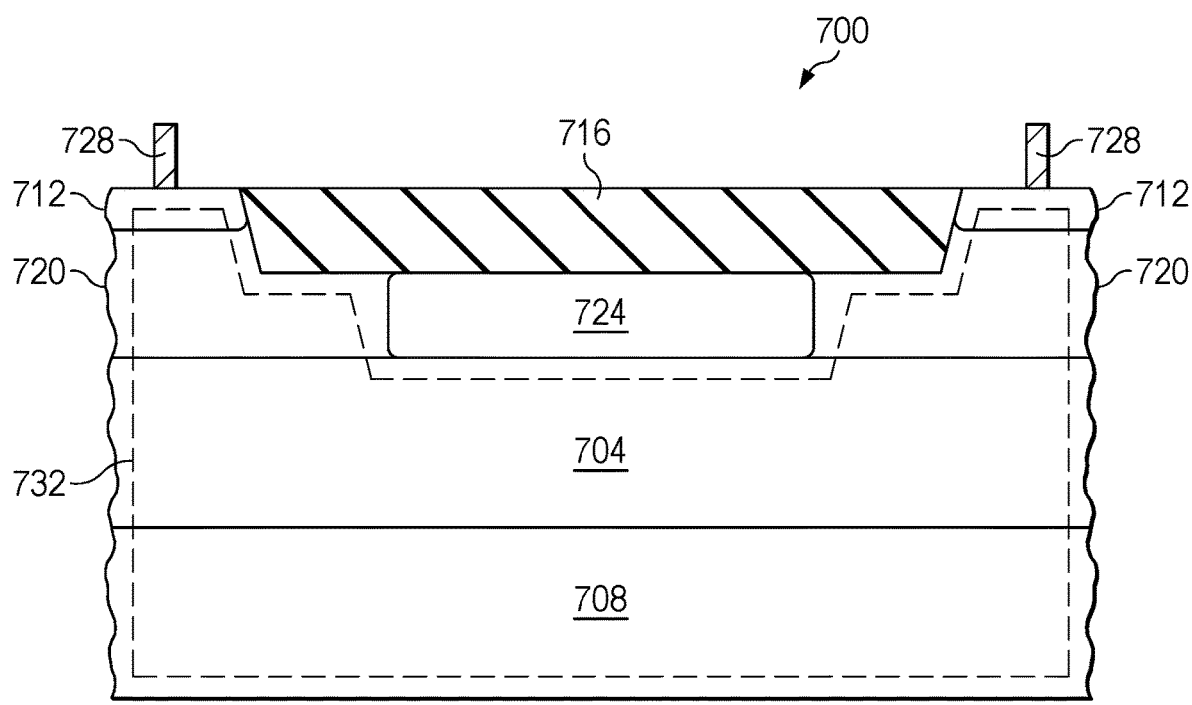
FIG. 12 is a schematic sectional view of another example implementation of the apparatus shown in FIG. 11.

FIG. 12 is a schematic sectional view of a portion 700 of another example implementation of a junction-isolated thermopile according to one or more aspects of the present disclosure. The portion 700 includes one or more layers 704 formed over a p-type substrate 708. The one or more layers 704 may include a PBL, a PRSRF, a p-epi, and/or other p-type features. A PSD-doped active semiconductor region 712 extends around an STI 716, which extends vertically through the doped region 712 into underlying SPWELLs 720. An SNWELL 724 is also formed laterally between the SPWELLs 720. Contacts 728 connect to the doped region 712 for sensing the thermopile voltage. The dashed lines 732 indicate the semiconductor portions that act as the p-type thermopile. The SNWELL 724 is not part of the p-type thermopile as shown in FIG. 12.

Figure 13:
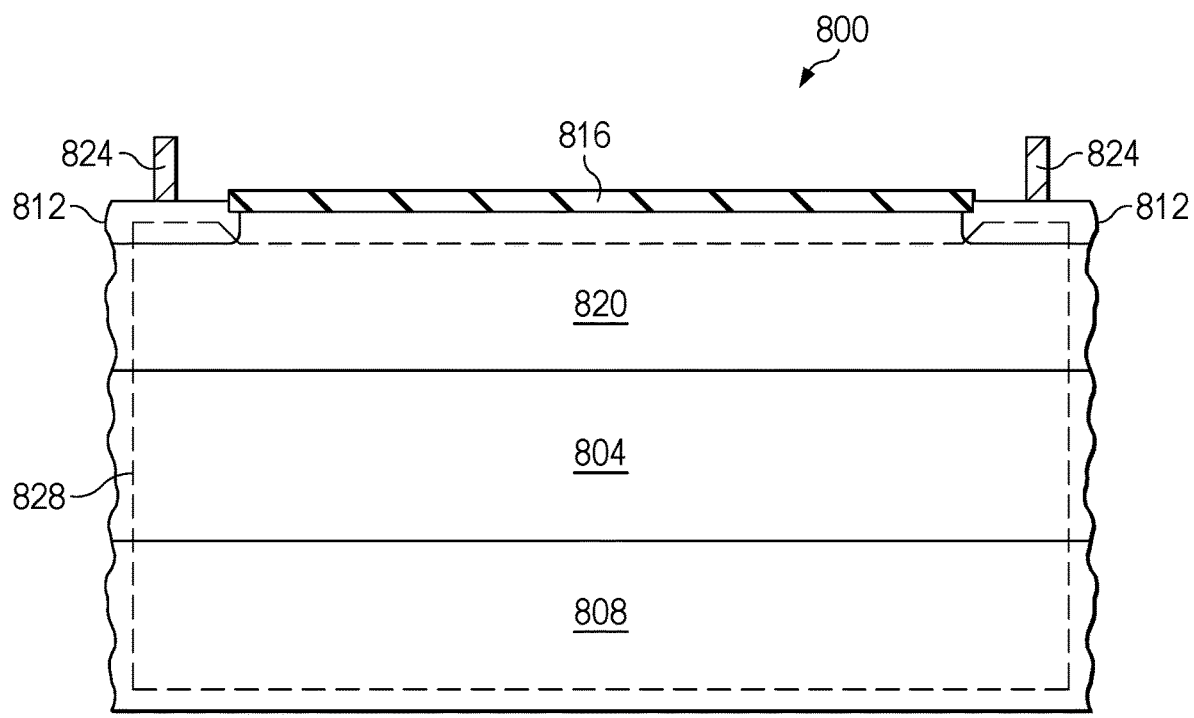
FIG. 13 is a schematic sectional view of another example implementation of the apparatus shown in FIG. 12.

FIG. 13 is a schematic sectional view of a portion 800 of yet another example implementation of a junction-isolated thermopile according to one or more aspects of the present disclosure. The portion 800 includes one or more layers 804 formed over a p-type substrate 808. The one or more layers 804 may include a PBL, a PRSRF, a p-epi, and/or other p-type features. A PSD-doped active semiconductor region 812 extends around a silicide block dielectric layer 816, which extends vertically through the doped region 812 into an underlying SPWELL 820. Contacts 824 connect to the doped region 812 for sensing the thermopile voltage. The dashed lines 828 indicate the semiconductor portions that act as the p-type thermopile.

FIG. 14 is a schematic plan view of the power transistor IC apparatus 100 shown in FIG. 1 in a subsequent stage of manufacturing, in which an example implementation 900 of the above-described interconnect structures has been formed over the devices depicted in FIG. 1. Such devices, including the thermocouple array 101, the thermopile 102, the thermocouple 103, the power transistors 114, and the non-power transistors 118, are depicted in FIG. 14 by dashed lines. Unreferenced vias connecting such devices to conductors of the interconnect structure 900 are also depicted in FIG. 14 by small dashed-line circles.

With regard to the thermocouple array 101, the example interconnect structure depicted in FIG. 14 includes conductors 904 (similar to or the same as the conductors 150 shown in FIG. 2) formed to connect non-contact ends of the p-n alternating thermopiles 142, 146 in the serpentine arrangement depicted in FIG. 2. Additional conductors 908 are formed as contacts connecting the opposing ends of the thermocouple array 101. With regard to the thermopile 102, one or more conductors 912 may be formed as contacts (e.g., conductors 278, 280 in FIG. 4) connected to the ohmic contacts in the deep well 134.

With regard to the thermocouple 103, FIG. 14 also depicts the conductor 318 (described with respect to FIG. 5) formed to connect the ends 316 of the thermopiles 304, 308. Additional conductors 916 are formed as contacts connecting the other ends 326 of the doped polysilicon layers 304, 308.

The interconnect structure may also include conductors associated with the thermopile implementations depicted in FIGS. 7-13. For example, the example implementation depicted in FIG. 14 includes additional conductors 928 contacting the inner conductive portions 112 of the isolation structure 110.

The interconnect structure also includes conductors formed as contacts to, and perhaps interconnecting, features of the power transistors 114 and the non-power transistors 118. For example, multiple conductors 920 may be formed to contact the source 122, the gate 126, the drain 138, and/or the deep well 134 of one or more of the power transistors 114. Similar conductors 932 may be formed to contact the sources 232, the drains 236, and the gates 240 of the non-power transistors 118.

The interconnect structure depicted in FIG. 14 also includes the thermopile 105, comprising a conductor having a serpentine pattern and separated from the other conductors by the interlayer dielectric layers in the interconnect structure. While the thermopile 105 is not electrically connected to the power transistors 114, it is arranged over the power transistors 114 so as to experience heat generated by the power transistors 114.

The thermopile 105 may be formed by the same deposition and/or other processing steps that form the other conductors shown in FIG. 14. For example, the thermopile 105 and the other conductors shown in FIG. 14 may be simultaneously formed by deposition and subsequent planarization of aluminum, damascene copper, plated top copper, tungsten, a silicide (such as tungsten, vanadium, titanium, cobalt, nickel, or platinum), and/or other conductive materials. Using a metal layer as a thermopile has the advantage of the low series resistance of the metal.

The power transistor IC apparatus according to one or more aspects introduced herein each include an integrated thermoelectric device that senses temperature differences which directly reflect heat flow along the thermopile. In contrast, the conventional practice of using a thermal diode senses absolute temperature. By directly sensing temperature gradients, the thermoelectric devices introduced herein are a more accurate way to sense power dissipation in a power transistor array relative to a thermal diode, because the conventional thermal diodes sense absolute temperature which are affected by background temperature variations from the ambient environment, a circuit board comprising the power transistor IC, and/or other areas of the IC. The thermoelectric devices introduced herein can also sense local temperature differences to detect the formation of a hot spot, which is a direct indication of thermal runaway.

The thermoelectric devices introduced herein, as sensors, also have the advantage of producing differential voltage signals, which is simple to sense using a differential amplifier and/or other circuitry. In contrast, thermal diodes require more complex circuitry for temperature readout. For example, when a thermal diode is used in a delta-VBE (base-emitter voltage) configuration as in a bandgap reference, current biasing circuitry is required for configuration, which also dissipates power. However, the thermoelectric devices introduced herein are self-biasing through majority carrier diffusion so that, in effect, the thermoelectric devices power their own operation by harvesting thermal energy from the crystal lattice.

In view of the entirety of the present disclosure, including the figures and the claims, a person having ordinary skill in the art will readily recognize that the present disclosure introduces an IC apparatus comprising: a power transistor constructed in a plurality of layers formed in or over a semiconductor substrate; a thermoelectric device formed in one or more of the plurality of layers; and first and second interconnections respectively electrically connected to first and second terminals of the thermoelectric device, wherein the thermoelectric device is configured to produce a voltage difference between the first and second interconnections in response to temperature differences within the IC apparatus resulting from operation of the power transistor.

The thermoelectric device may include an array of thermocouples electrically connected in series, and each thermocouple may comprise a p-doped polysilicon thermopile and an n-doped polysilicon thermopile.

The IC apparatus may further comprise a non-power transistor constructed in the plurality of layers and electrically isolated from the power transistor by a deep isolation trench extending through ones of the plurality of layers, wherein the plurality of layers may comprise a dielectric layer and a doped polysilicon layer over the dielectric layer, and wherein the doped polysilicon layer may be patterned to form: a gate of at least one of the power and non-power transistors; and a thermoelectric portion of a thermopile of the thermoelectric device.

The IC apparatus may further comprise an interconnect structure comprising a plurality of first conductors separated by interlayer dielectric layers and interconnecting ohmic connections of the power transistor, wherein the thermoelectric device may include a thermopile formed from one or more second conductors, including the first and second interconnections, separated by the interlayer dielectric layers and not electrically connected to the ohmic connections of the power transistor.

An n-type isolation tank may be at least partially formed by one or more of the plurality of layers, the power transistor may be contained within the n-type isolation tank, and the thermoelectric device may be an n-type thermopile formed by an n-type doped portion of a periphery of the power transistor within the n-type isolation tank. The n-type doped portion forming the n-type thermopile may be doped with the same concentration as one of: an n-doped deep trench extending through ones of the plurality of layers to the semiconductor substrate; an n-doped deep well extending through ones of the plurality of layers but not to the semiconductor substrate; and a shallow n-doped well formed in one of the plurality of layers. The power transistor may further comprise: a drain ohmic connection comprising a first heavily n-doped active semiconductor region that is connected to, and has a doping profile merged with, an inner portion of the n-type thermopile; and an n-isolation ohmic connection comprising a second heavily n-doped semiconductor silicon region that is connected to, and has a doping profile merged with, outer edges of the n-type isolation tank; wherein the n-type thermopile may further comprise a hot end electrical connection to the drain ohmic connection and a cold end electrical connection to the n-isolation ohmic connection.

The semiconductor substrate may be a p-type semiconductor substrate, and the thermoelectric device may be a p-type thermopile comprising p-type ohmic connections extending through ones of the plurality of layers between: a top surface of an uppermost active semiconductor layer of the plurality of layers; and a bulk portion of the semiconductor substrate. Each p-type ohmic connection may be collectively formed by corresponding portions of: a p-doped active semiconductor region formed in one of the plurality of layers that also contains p-type source/drain regions of the power transistor, wherein the p-doped active semiconductor region has the same dopant concentration as the p-type source/drain regions; and a p-type shallow well formed in one of the plurality of layers. The power transistor may be surrounded by a trench extending through the plurality of layers into the bulk portion of the semiconductor substrate, and the p-type ohmic connections may be formed by corresponding conductive portions of the trench.

The power transistor may be one of an array of power transistors separated into a plurality of transistor banks by isolation structures, the thermoelectric device may be one of plurality of a p-type thermopiles each comprising p-type ohmic connections extending through ones of the plurality of layers between a top surface of an uppermost active semiconductor layer of the plurality of layers and a different corresponding portion of a bulk portion of the semiconductor substrate, and the p-type ohmic connections may be laterally disposed in a pattern based on equithermal lines of the array.

The present disclosure also introduces a method of manufacturing an IC, the method comprising: forming a power transistor in a plurality of layers formed in or over a semiconductor substrate; and forming in one or more of the plurality of layers a thermoelectric device having first and second terminals, wherein the thermoelectric device is configured to produce a voltage difference between the first and second terminals in response to a temperature gradient along the thermoelectric device resulting from operation of the power transistor.

Forming the thermoelectric device may comprise implanting one of the plurality of layers to simultaneously dope source/drain regions of the power transistor and a thermopile of the thermoelectric device.

The method may further comprise constructing a non-power transistor in the plurality of layers that is electrically isolated from the power transistor by a deep isolation trench extending through ones of the plurality of layers, wherein: the plurality of layers may comprise a doped polysilicon layer; and a gate of the power transistor, a gate of a non-power transistor, and a thermoelectric portion of a thermopile of the thermoelectric device may be formed from the doped polysilicon layer.

The method may further comprise forming an interconnect structure in one or more of the plurality of layers, the interconnect structure comprising: a plurality of first conductors interconnecting ohmic connections of the power transistor; and one or more second conductors forming a thermopile of the thermoelectric device, wherein the one or more second conductors are not electrically connected to the ohmic connections of the power transistor.

The method may further comprise: constructing the power transistor in part within an n-type isolation tank that includes one or more of the plurality of layers; and forming a thermopile of the thermoelectric device by implanting an n-type dopant into a portion of a periphery of the power transistor within the isolation tank.

The semiconductor substrate may be a p-type semiconductor substrate and forming the thermoelectric device may comprise forming p-type ohmic connections extending through ones of the plurality of layers between: a top surface of an uppermost active semiconductor layer of the plurality of layers; and a bulk portion of the semiconductor substrate. Each p-type ohmic connection may be collectively formed by corresponding portions of: a p-type active semiconductor region formed in one of the plurality of layers; a p-type region formed in one of the plurality of layers comprising p-type source/drain regions of the power transistor and with the same concentration as the p-type source/drain regions; and a p-type shallow well formed in one of the plurality of layers. The power transistor may be surrounded by a trench extending through the plurality of layers into the bulk portion of the semiconductor substrate, and each p-type ohmic connection may be collectively formed by corresponding conductive portions of the trench.

The power transistor may be one of an array of power transistors constructed in the plurality of layers and separated into a plurality of transistor banks by isolation structures. The thermoelectric device may be one of plurality of a p-type thermopiles laterally disposed in a pattern based on equithermal lines of the array of power transistors. The p-type thermopiles may be constructed simultaneously with the array of power transistors, including by forming p-type ohmic connections extending through ones of the plurality of layers between a top surface of an uppermost active semiconductor layer of the plurality of layers and corresponding portions of a bulk portion of the semiconductor substrate.

The foregoing outlines features of several embodiments so that a person having ordinary skill in the art may better understand the aspects of the present disclosure. A person having ordinary skill in the art will appreciate that they may readily use the present disclosure as a basis for designing or modifying other processes and structures for carrying out the same functions and/or achieving the same benefits of the embodiments introduced herein. A person having ordinary skill in the art will also realize that such equivalent constructions do not depart from the scope of the present disclosure, and that they may make various changes, substitutions and alterations herein without departing from the scope of the present disclosure.

The Abstract at the end of this disclosure is provided to comply with 37 C.F.R. § 1.72(b) to permit the reader to quickly ascertain the nature of the technical disclosure. It is submitted with the understanding that it will not be used to interpret or limit the scope or meaning of the claims.

What is claimed is:

1. An integrated circuit (IC) apparatus, comprising:
   a power transistor constructed in a plurality of layers formed in or over a semiconductor substrate;

an n-type isolation tank at least partially formed by one or more of the plurality of layers, the power transistor contained within the n-type isolation tank; and
a thermoelectric device formed in one or more of the plurality of layers, the thermoelectric device including an n-type thermopile formed by an n-type doped portion of a periphery of the power transistor within the n-type isolation tank.

2. The IC apparatus of claim 1 wherein the thermoelectric device includes an array of thermocouples electrically connected in series, and wherein each thermocouple comprises a p-doped polysilicon thermopile and an n-doped polysilicon thermopile.

3. The IC apparatus of claim 1 further comprising a non-power transistor constructed in the plurality of layers and electrically isolated from the power transistor by a deep isolation trench extending through ones of the plurality of layers, wherein:
the plurality of layers comprises a dielectric layer and a doped polysilicon layer over the dielectric layer; and
the doped polysilicon layer is patterned to form:
a gate of at least one of the power and non-power transistors; and
a thermoelectric portion of a thermopile of the thermoelectric device.

4. The IC apparatus of claim 1 further comprising:
first and second interconnections respectively electrically connected to first and second terminals of the thermoelectric device, the thermoelectric device configured to produce a voltage difference between the first and second interconnections in response to temperature differences within the IC apparatus resulting from operation of the power transistor; and
an interconnect structure comprising a plurality of first conductors separated by interlayer dielectric layers and interconnecting ohmic connections of the power transistor, wherein the thermoelectric device includes a thermopile formed from one or more second conductors, including the first and second interconnections, separated by the interlayer dielectric layers and not electrically connected to the ohmic connections of the power transistor.

5. The IC apparatus of claim 1 wherein the n-type doped portion forming the n-type thermopile is doped with the same concentration as one of:
an n-doped deep trench extending through ones of the plurality of layers to the semiconductor substrate;
an n-doped deep well extending through ones of the plurality of layers but not to the semiconductor substrate; and
a shallow n-doped well formed in one of the plurality of layers.

6. The IC apparatus of claim 1 wherein:
the power transistor further comprises:
a drain ohmic connection comprising a first heavily n-doped active semiconductor region that is connected to, and has a doping profile merged with, an inner portion of the n-type thermopile; and
an n-isolation ohmic connection comprising a second heavily n-doped semiconductor silicon region that is connected to, and has a doping profile merged with, outer edges of the n-type isolation tank; and
the n-type thermopile further comprises:
a hot end electrical connection to the drain ohmic connection; and a cold end electrical connection to the n-isolation ohmic connection.

7. The IC apparatus of claim 1 wherein:
the semiconductor substrate is a p-type semiconductor substrate; and
the thermoelectric device is a p-type thermopile comprising p-type ohmic connections extending through ones of the plurality of layers between:
a top surface of an uppermost active semiconductor layer of the plurality of layers; and
a bulk portion of the semiconductor substrate.

8. The IC apparatus of claim 7 wherein each p-type ohmic connection is collectively formed by corresponding portions of:
a p-doped active semiconductor region formed in one of the plurality of layers that also contains p-type source/drain regions of the power transistor, wherein the p-doped active semiconductor region has the same dopant concentration as the p-type source/drain regions; and
a p-type shallow well formed in one of the plurality of layers.

9. The IC apparatus of claim 7 wherein:
the power transistor is surrounded by a trench extending through the plurality of layers into the bulk portion of the semiconductor substrate; and
the p-type ohmic connections are formed by corresponding conductive portions of the trench.

10. The IC apparatus of claim 1 wherein:
the power transistor is one of an array of power transistors separated into a plurality of transistor banks by isolation structures;
the thermoelectric device is one of plurality of a p-type thermopiles each comprising p-type ohmic connections extending through ones of the plurality of layers between:
a top surface of an uppermost active semiconductor layer of the plurality of layers; and
a different corresponding portion of a bulk portion of the semiconductor substrate; and
the p-type ohmic connections are laterally disposed in a pattern based on equithermal lines of the array.

11. An integrated circuit, comprising:
a power transistor constructed in a plurality of layers formed in or over a p-type semiconductor substrate; and
a thermoelectric device formed in one or more of the plurality of layers, the thermoelectric device including a p-type thermopile having p-type ohmic connections extending through ones of the plurality of layers between a top surface of an uppermost active semiconductor layer of the plurality of layers and a bulk portion of the semiconductor substrate,
wherein each p-type ohmic connection is collectively formed by corresponding portions of:
a p-doped active semiconductor region formed in one of the plurality of layers that also contains p-type source/drain regions of the power transistor, wherein the p-doped active semiconductor region has the same dopant concentration as the p-type source/drain regions; and
a p-type shallow well formed in one of the plurality of layers.

12. An integrated circuit (IC), comprising:
a power transistor constructed in a plurality of layers formed in or over a p-type semiconductor substrate; and a thermoelectric device formed in one or more of the plurality of layers, the thermoelectric device including a p-type thermopile having p-type ohmic connections extending through ones of the plurality of layers between a top surface of an uppermost active semiconductor layer of the plurality of layers and a bulk portion of the semiconductor substrate, wherein:
the power transistor is surrounded by a trench extending through the plurality of layers into the bulk portion of the semiconductor substrate; and
the p-type ohmic connections are formed by corresponding conductive portions of the trench.

13. The IC of claim 12, wherein the thermoelectric device includes an array of thermocouples electrically connected in series, and wherein each thermocouple comprises a p-doped polysilicon thermopile and an n-doped polysilicon thermopile.

14. An integrated circuit (IC), comprising:
a power transistor constructed in a plurality of layers formed in or over a semiconductor substrate; and
a thermoelectric device formed in one or more of the plurality of layers, wherein:
the power transistor is one of an array of power transistors separated into a plurality of transistor banks by isolation structures;
the thermoelectric device is one of plurality of a p-type thermopiles each comprising p-type ohmic connections extending through ones of the plurality of layers between:
a top surface of an uppermost active semiconductor layer of the plurality of layers; and
a different corresponding portion of a bulk portion of the semiconductor substrate; and
the p-type ohmic connections are laterally disposed in a pattern based on equithermal lines of the array.

15. The IC of claim 14, wherein the thermoelectric device includes an array of thermocouples electrically connected in series, and wherein each thermocouple comprises a p-doped polysilicon thermopile and an n-doped polysilicon thermopile.

* * * * *